US012777956B2

(12) United States Patent
Hahn et al.

(10) Patent No.: US 12,777,956 B2
(45) Date of Patent: Oct. 27, 2026

(54) WET ATOMIC LAYER ETCHING METHOD AND METHOD OF MANUFACTURING THE SAME

(71) Applicant: Samsung Electronics Co., Ltd., Suwon-si (KR)

(72) Inventors: Seungho Hahn, Suwon-si (KR); Wooyoung Kim, Suwon-si (KR); Minwoo Rhee, Suwon-si (KR); Bumki Moon, Suwon-si (KR); Kyeongbin Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 323 days.

(21) Appl. No.: 18/405,791

(22) Filed: Jan. 5, 2024

(65) Prior Publication Data

US 2024/0321805 A1 Sep. 26, 2024

(30) Foreign Application Priority Data

Mar. 21, 2023 (KR) ........................ 10-2023-0036377

(51) Int. Cl.
*H10W 72/00* (2026.01)

(52) U.S. Cl.
CPC .... *H10W 72/013* (2026.01); *H10W 72/01353* (2026.01); *H10W 72/01365* (2026.01)

(58) Field of Classification Search
CPC . H10W 72/019; H10W 72/90; H10W 72/931; H10W 80/033; H10W 80/701; H10W 80/732; H10W 90/792; H10W 99/00; H10P 50/667; H10P 70/27; H10P 95/04
See application file for complete search history.

(56) References Cited

U.S. PATENT DOCUMENTS 8,242,029 B2 8/2012 Zagwijn et al.
8,802,538 B1 * 8/2014 Liu ........................ H10P 10/128 438/455
8,969,218 B2 3/2015 Watanabe et al.
9,735,024 B2 8/2017 Zaitsu
10,096,487 B2 10/2018 Yang et al.
10,163,623 B1 12/2018 Kelly et al.
(Continued)

FOREIGN PATENT DOCUMENTS

KR 10-2021-0076994 A 6/2021

OTHER PUBLICATIONS

Netzband et al., "Wet atomic layer etching of copper structures for highly scaled copper hybrid bonding and fully aligned vias," 2022 IEEE 72nd Electronic Components and Technology Conference (ECTC). IEEE, 2022.

*Primary Examiner* — Fazli Erdem
(74) *Attorney, Agent, or Firm* — Muir Patent Law, PLLC

(57) ABSTRACT

A method of manufacturing a semiconductor device includes preparing a first substrate and a second substrate respectively including a bonding layer having metal pads and a dielectric layer, performing a planarization process on a surface of the bonding layer of each of the first and second substrates, applying wet atomic layer etching to the surface of the bonding layer so that a surface of the metal pad is recessed to a target depth, and bonding the bonding layer of the first substrate to the bonding layer of the second substrate using an annealing process.

20 Claims, 20 Drawing Sheets

(56) References Cited

U.S. PATENT DOCUMENTS

| | | | | |
|---|---|---|---|---|
| 10,818,622 | B2 | 10/2020 | Chaji et al. | |
| 11,306,249 | B2 | 4/2022 | Hiroshiro et al. | |
| 2020/0157693 | A1 | 5/2020 | Abel | |
| 2023/0108117 | A1 * | 4/2023 | Voronin | C23F 4/00 438/107 |
| 2023/0140900 | A1 * | 5/2023 | Netzband | C23F 1/18 |

* cited by examiner

570A

WET ATOMIC LAYER ETCHING METHOD AND METHOD OF MANUFACTURING THE SAME

CROSS-REFERENCE TO RELATED APPLICATION(S)

This application claims benefit of priority to Korean Patent Application No. 10-2023-0036377 filed on Mar. 21, 2023 in the Korean Intellectual Property Office, the disclosure of which is incorporated herein by reference in its entirety.

BACKGROUND

The present inventive concept relates to a hybrid bonding and system using wet atomic layer etching and a method of manufacturing a semiconductor device.

As miniaturization of integrated circuits has reached a physical limit, a stacking technology for improving the degree of integration by stacking and bonding completed devices has emerged. As such a stacking technology, thermo-compressive (TC) bonding using solder bumps, etc. has generally been used, but recently, as demand for higher density of interconnection has increased, hybrid bonding using a dielectric-metal pad bonding layer has come to prominence.

In particular, in hybrid bonding, metal (e.g., Cu) pads are directly bonded without an intermediary (e.g., solder bumps), thereby advantageously shortening a signal transmission path between devices. However, as metal pads become ultra-miniaturized, development of precise technology is required to ensure robust bonding.

SUMMARY

In one aspect disclosed herein, a wet atomic layer etching method is provided capable of precisely controlling a dishing step of a metal pad in a metal-dielectric bonding layer.

In another aspect, a method of manufacturing a semiconductor device is provided capable of realizing robust hybrid bonding.

In another aspect, a hybrid bonding system is provided capable of implementing robust hybrid bonding.

According to another aspect, a method of manufacturing a semiconductor device includes: preparing a first substrate and a second substrate respectively including a bonding layer having metal pads and a dielectric layer; performing a planarization process on a surface of the bonding layer of each of the first and second substrates; applying wet atomic layer etching to the surface of the bonding layer so that a surface of the metal pad is recessed to a target depth; and bonding the bonding layer of the first substrate to the bonding layer of the second substrate using an annealing process.

According to another aspect, a method of manufacturing a semiconductor device includes: preparing a first substrate and a second substrate respectively including a bonding layer having metal pads and a dielectric layer; polishing the bonding layer of each of the first and second substrates such that the metal pads have a surface substantially coplanar with a surface of the dielectric layer, the metal pad having a surface recessed to a first depth, relative to the surface of the dielectric layer; applying wet atomic layer etching to a surface of the bonding layer so that the surface of the metal pad is recessed to a second depth, deeper than the first depth; and bonding the bonding layer of the first substrate to the bonding layer of the second substrate using an annealing process, wherein the applying of the wet atomic layer etching includes: oxidizing the surface layer of the metal pad forming a metal complex on the oxidized surface layer, using an acid solution to bond; and removing the surface layer to which the metal complex is bonded using a basic solution and reacting hydroxide ions (OH—) of the basic solution with the surface of the dielectric layer.

According to another aspect, a wet atomic layer etching method includes: preparing a bonding layer having metal pads and a dielectric layer; a first reaction step of applying an acid solution to the bonding layer to oxidize a surface layer of the metal pad and reacting with the oxidized surface layer to form a metal complex; a first rinsing step of cleaning the bonding layer after the first reaction step; a second reaction process of applying a basic solution to the bonding layer to remove the surface layer to which the metal complex is bonded, and reacting hydroxide ions (OH—) of the basic solution react with the surface of the dielectric layer; a second rinsing process of cleaning the bonding layer after the second reaction process; and repeating the first reaction process, the first rinsing process, the second reaction process, and the second rinsing process a plurality of times until the metal pad is recessed to a desired depth.

According to another aspect, a hybrid bonding system for bonding first and second substrates respectively including a bonding layer having metal pads and a dielectric layer, including: a transfer chamber having a transfer robot transferring the first and second substrates; an etching chamber connected to the transfer chamber and including an etching chamber selectively wet-etching surfaces of the metal pads of the first and second substrates, a first pipe supplying an acid solution into the etching chamber, a second pipe supplying a base solution into the etching chamber, and a third pipe supplying a cleaning solution into the etching chamber; and a bonding module connected to the transfer chamber and having a bonding chamber bonding the first and second substrates processed in the wet atomic layer etching module.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Spatially relative terms, such as "beneath," "below," "lower," "above," "upper," "top," "bottom," "front," "rear," and the like, may be used herein for ease of description to describe positional relationships, such as illustrated in the figures, for example. It will be understood that the spatially relative terms encompass different orientations of the device in addition to the orientation depicted in the figures.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive.

Figure 1:
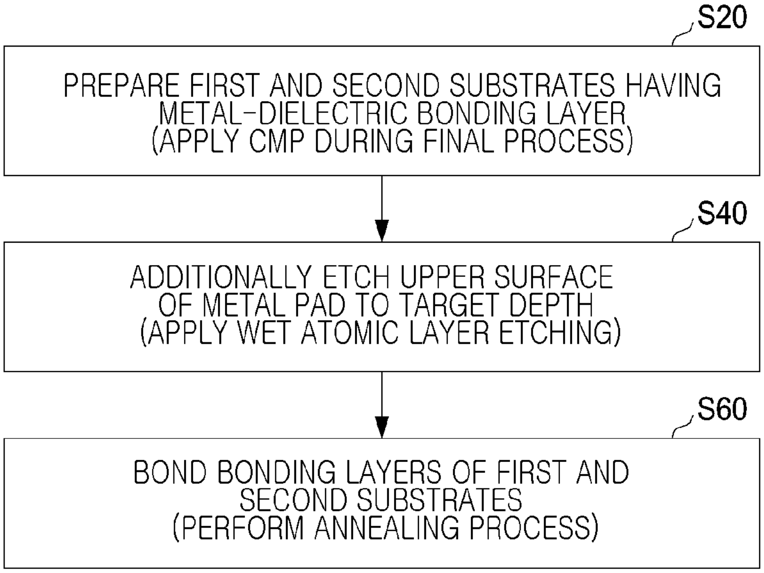
FIG. 1 is a process flowchart illustrating a method of manufacturing a semiconductor device according to an embodiment of the present inventive concept.

FIG. 1 is a process flow diagram illustrating a method of manufacturing a semiconductor device according to an embodiment of the present inventive concept, and FIGS. 2A to 2D are cross-sectional views of processes of a hybrid bonding method according to an embodiment of the present inventive concept. A portion illustrated in FIGS. 2A to 2D may be understood as a portion corresponding to portion "A" of semiconductor device 300 of FIG. 3.

Referring to FIG. 1, the method of manufacturing a semiconductor device according to the present embodiment may start with preparing a first substrate and a second substrate respectively including a bonding layer having metal pads and a dielectric layer (S20).

The first and second substrates may be wafers on which a plurality of first and second semiconductor devices are implemented, respectively. The first and second substrates may be firmly bonded by hybrid bonding between bonding layers having metal pads and a dielectric layer to provide assemblies of first and second semiconductor devices. The semiconductor devices may be electrically connected to each other through bonding of metal pads. The metal pads of the semiconductor devices described herein may be conductive terminals connected to internal wiring of the devices, and may transmit signals and/or supply voltages between an internal wiring and/or internal circuit of one semiconductor device to the other semiconductor device. For example, chip pads of a semiconductor chip may electrically connect to and transmit supply voltages and/or signals between an integrated circuit of the semiconductor chip, such as a vertical NAND device, and a device to which the semiconductor chip is connected, such as a peripheral circuit device or an additional vertical NAND device.

Figure 2A:
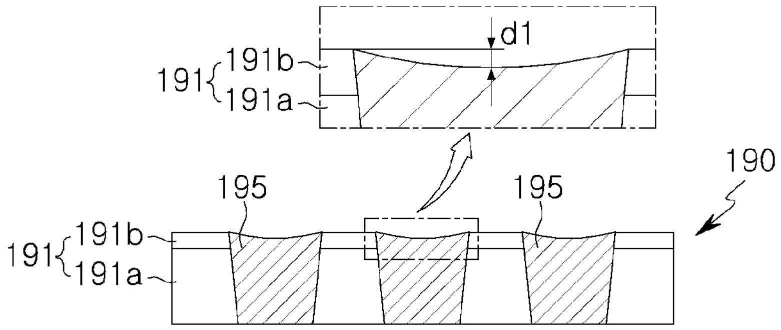
FIGS. 2A to 2D are cross-sectional views of processes of a hybrid bonding method according to an embodiment of the present inventive concept.

As illustrated in FIG. 2A, a first bonding layer 190 for the first substrate includes a first dielectric layer 191 and a first metal pad 195 embedded in the first dielectric layer 191. Similarly, as illustrated in FIG. 2C, a second bonding layer 290 for the second substrate includes a second dielectric layer 291 and a second metal pad 295 embedded in the second dielectric layer 291.

For example, the first and second metal pads 195 and 295 may include an electrically conductive metal. The metal can be a transition metal and have an electrical resistivity of from about 15 to about 65 nΩ·m at 20° C. The metal can be a refractory metal, or a noble metal. The first and second metal pads may include for example Cu, Co, Mo, Ru, W, or alloys thereof. Electrically conductive metal compounds may also be used in the first and second pads. And though the first and second pads may be of the same material, it is possible for the first pad to be of a first material and second pad to be of a second material. The first and second dielectric layers 191 and 291 may include a silicon compound such as at least one of $SiO_2$, SiN, SiCN, SiOC, SiON, and SiOCN, though other dielectric compounds are also possible. In the present embodiment, the first and second dielectric layers 191 and 291 may include first insulating layers 191*a* and 291*a* and second insulating layers 191*b* and 291*b* including different materials, respectively. For example, the first insulating layers 191*a* and 291*a* may be silicon oxide, and the second insulating layers 191*b* and 291*b* may be silicon oxynitride, silicon carbonitride, or silicon nitride.

By performing a planarization process, such as chemical mechanical polishing (CMP) to respective bonding surfaces of the first bonding layer 190 and the second bonding layer 290, the first metal pad 195 may have a surface substantially planar with a surface of the first dielectric layer 191, and similarly, the second metal pad 295 may have a surface substantially planar with a surface of the second dielectric layer 291.

In the present embodiment, a surface DS of the first metal pad 195 may be recessed to a first depth d1 by the planarization process to have a dishing shape. A surface of the second metal pad 295 may also have a dishing shape similar to that of the first metal pad 195. In a subsequent bonding process, high-temperature annealing is applied, and in this process, the first and second metal pads 195 and 295 thermally expand. Therefore, a dishing shape recessed like a dish is preferable to minimize stress propagation to the surrounding dielectric layer. An appropriate degree of dishing of the first and second metal pads 195 and 295 is required, and the appropriate degree of dishing may be expressed as a "target depth" of the center. Here, the "target depth" may be defined as a depth corresponding to a height at which the metal pads 195 and 295 are expanded during an annealing process for bonding between the metal pads 195 and 295 (refer to FIG. 2C).

For example, if the final depth of the surface of the first metal pad 195 is less than the target depth, stress may be applied to the dielectric layers 191 and 291 surrounding the metal pads 195 and 295 by lateral expansion of the corresponding metal pads 195 and 295 to cause delamination or damage, and if the final depth of the surface of the first metal pad 195 is excessively greater than the target depth, the corresponding metal pads 195 and 295 may not fully contact and may be difficult to firmly bond.

In particular, as the metal pads 195 and 295 are miniaturized (e.g., width: 10 μm or less, in a specific embodiment, 2 μm or less), it is necessary to precisely control the depth of the metal pads 195 and 295 within a few to several tens of Å units. However, since it is difficult to guarantee such precise control with only a planarization process, such as CMP, the first depth d1 recessed by the present process (e.g., CMP) is formed to be less than the "target depth" and may be controlled to a desired target depth through an additional precise control process.

Unlike the above-described example, a surface of the metal pad may have a shape slightly protruding relative to the surface of the dielectric layer even after the planarization process, or may have a surface substantially flat with the surface of the dielectric layer. Even in these cases, a process of precisely controlling the metal pad to have a dishing shape having a target depth by applying an additional etching process may be performed.

In the present embodiment, precise depth control of the metal pads 195 and 295 may be performed by wet atomic layer etching. That is, the upper surface of the metal pad may be additionally etched to a target depth using wet atomic layer etching (S40).

Figure 2B:
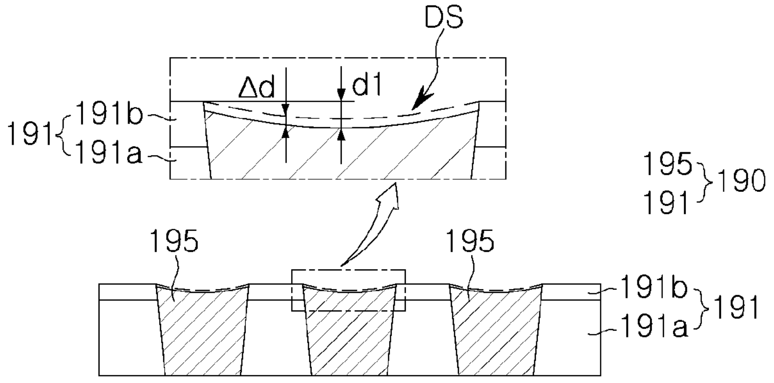
Figure 2C:
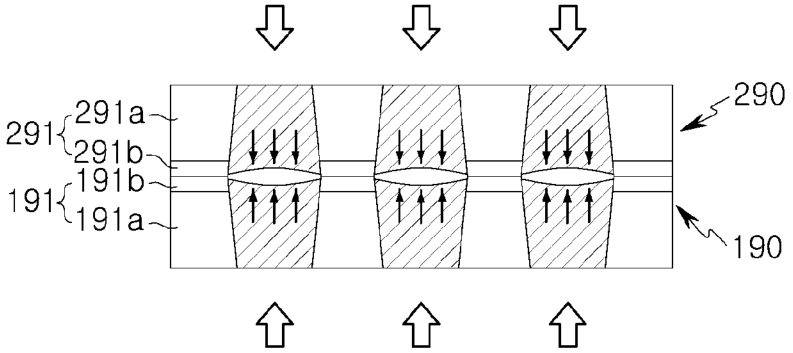
Figure 2D:
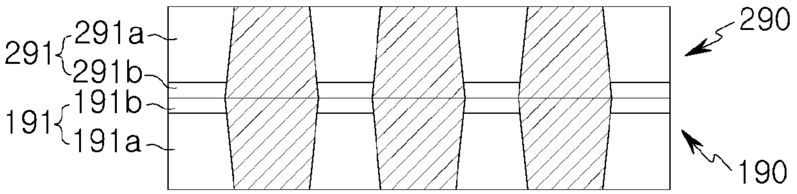

As illustrated in FIG. 2B, during a wet atomic layer etching process employed in the present embodiment, surfaces of the metal pads 195 and 295 may be selectively etched. In the atomic layer etching process, a first reaction process modifies a surface layer of a target material by weakening the binding energy of the surface so that it is easier to remove than the underlying non-modified target material. In a second reaction process the modified surface layer is removed without removal of the target material underlying the surface layer. In the wet atomic layer etching process, the first and second reaction processes may be performed with liquids applied to the target material. However, a partial wet atomic layer etching process is also possible, where one of the first and second reaction processes are with a liquid applied to the target material and the other of the first and second processes is in the absence of a liquid, such as by using temperature, gas, and/or plasma etc. The wet atomic layer etching process may be performed by a first reaction process of chemically modifying the surface layer using an acid solution and a second reaction process of selectively removing the surface layer using a base solution. In some embodiments, the thickness of the metal pads 195 may be etched in a range of 1 Å to 10 Å or 2 Å to 6 Å by performing the first reaction process and the second reaction process once. In order to etch the metal pads 195 to have a desired target depth d2, the first and second reaction processes may be repeatedly performed in a range of 5 to 50 times or 10 to 30 times. An additionally etched thickness Δd in this process may be controlled in the range of several Å to several tens of nm. As such, the depth of the metal pads may be precisely controlled to a target depth using wet atomic layer etching. Wet atomic layer etching will be described in detail with reference to FIGS. 4 and 5A to 5E.

Subsequently, as illustrated in FIG. 2C, after disposing the first and second substrates to face the first and second bonding layers 190 and 290, the first and second bonding layers 190 and 290 may be bonded using an annealing process (S60).

The first metal pad 195 and the second metal pad 295 may form an inter-metal junction. During the annealing process, the first and second metal pads may be expanded and bonded to each other. For example, the annealing process may be performed at a temperature of 250° C. or higher. Additionally, the first and second dielectric layers 191 and 291 may form an inter-dielectric junction. In this manner, the first and second substrates may be bonded through such "hybrid bonding" of the first and second bonding layers 190 and 290. The first and second substrates may be wafers on which a plurality of first and second semiconductor devices are formed, respectively. The wafers can be a semiconductor wafer (e.g., a silicon wafer), glass wafer, quartz wafer, etc., or portions of a wafer if e.g., bonding is performed at the die level, or other suitable substrate.

Figure 3:
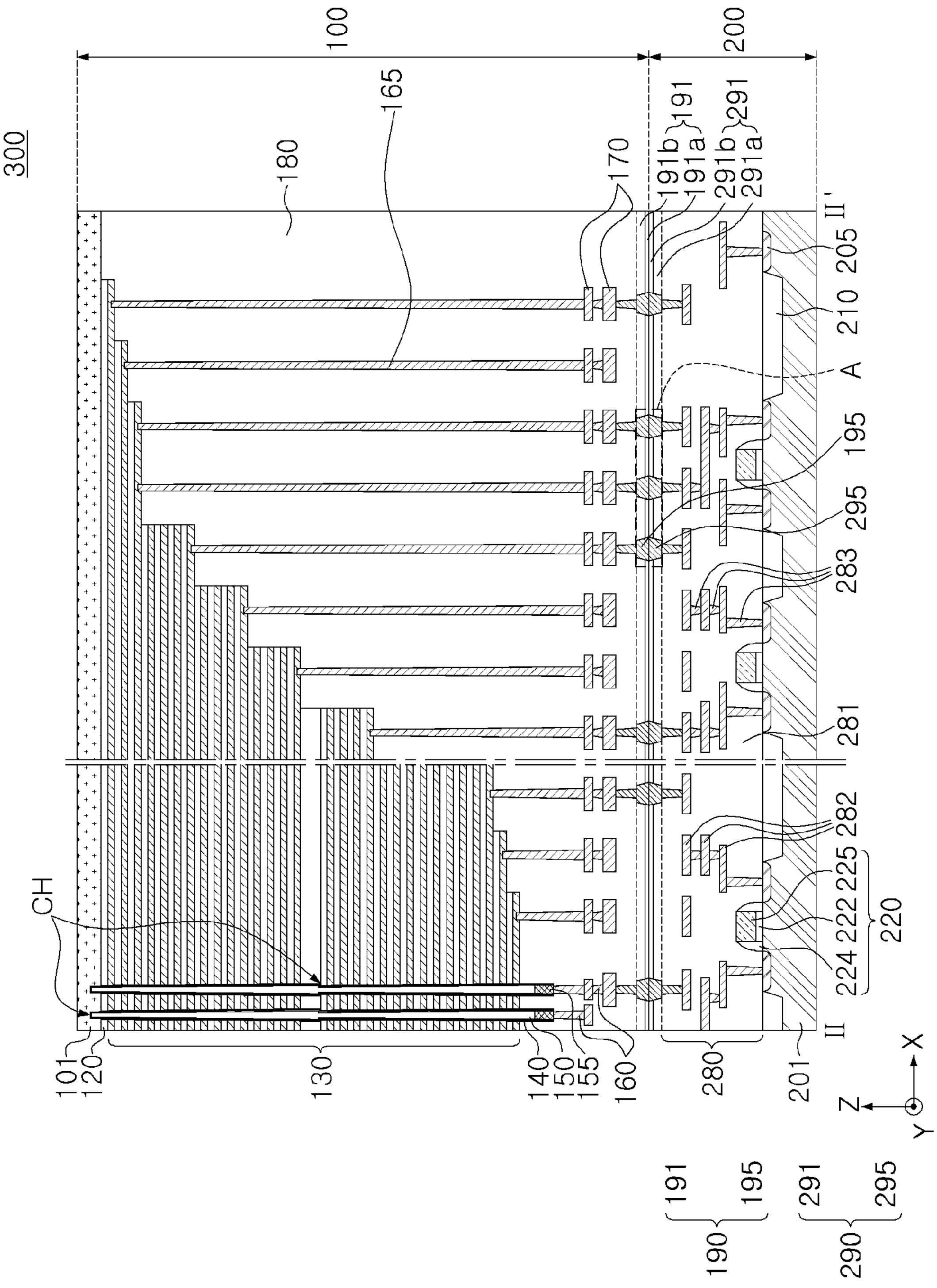
FIG. 3 is a side cross-sectional view illustrating an example of a semiconductor device bonded by hybrid bonding.

In some embodiments, the first and second semiconductor devices may be the same device. For example, the first and second semiconductor devices may be memory chips having through-electrodes, and an assembly of the bonded first and second semiconductor devices may be a high bandwidth memory (HBM). In some embodiments, the first and second semiconductor devices may be different devices. For example, as illustrated in FIG. 3, the first semiconductor device may be a logic chip or memory chip formed on a die, such as a 3D memory cell device, e.g. a vertical NAND, such as a NAND flash memory having at least 120 layers (e.g., 250 layers or more), and the second semiconductor device may be a peripheral circuit device. As described above, portions illustrated in FIGS. 2A to 2D may be understood as portions corresponding to portion "A" of the semiconductor device 300 of FIG. 3.

FIG. 3 is a side cross-sectional view illustrating a 3D memory device as an example of a semiconductor device bonded by hybrid bonding.

Referring to FIG. 3, a semiconductor device 300 includes hybrid-bonded first and second substrate structures 100 and 200. For example, the first substrate structure 100 includes a memory cell region of the semiconductor device 300 and the second substrate structure 200 includes a peripheral circuit region of the semiconductor device 300. Hereinafter, example structures of the first and second substrate structures 100 and 200 employed in the present embodiment will be described.

First, the first substrate structure 100 may include a first substrate 101, gate electrodes 130 stacked on a lower surface of the first substrate 101, interlayer insulating layers 120 alternately stacked with the gate electrodes 130, channel structures CH disposed to pass through the gate electrodes 130, and a cell region insulating layer 180 covering the gate electrodes 130. First substrate 101 may be a semiconductor substrate such as a single crystal silicon substrate, or another suitable substrate (glass, quartz, sapphire etc.) including a semiconductor layer formed thereon e.g., by epitaxial growth.

The gate electrodes 130 may be configured to form a step in an X-direction and also form a step in a Y-direction. Due to the step, a certain region including end portions of the gate electrodes 130 may be exposed. Gate contacts 165 may be formed on the exposed region of the gate electrodes 130 in the cell region insulating layer 180 in a vertical direction (a Z-direction).

In plan view, the cell region insulating layer 180 may include isolation regions (not illustrated) extending in one direction (e.g., the X-direction) through the gate electrodes 130. The first substrate 101 may include a conductive material layer, such as a semiconductor layer. An upper end of each of the channel structures CH may extend into the first substrate 101, and the channel layer 140 may be electrically connected to the first substrate 101.

The channel structures CH may be spaced apart from each other while forming rows and columns on the lower surface of the first substrate 101. In some embodiments, the channel structures CH may be arranged to form a lattice pattern or may be arranged in a zigzag shape in one direction. A channel layer 140 and a channel dielectric layer (not illustrated) may be disposed in the channel structure CH. The channel dielectric layer (not illustrated) may be disposed between the gate electrodes 130 and the channel layer 140 and may extend vertically along the channel layer 140. In the channel structure CH, the channel layer 140 may be formed in an annular shape surrounding an internal channel filling insulating layer 150, but in some embodiments, the channel layer 140 may have a cylindrical or pillar shape such as prism without the channel filling insulating layer 150. The channel layer 140 may include a semiconductor material, such as polycrystalline silicon or single crystal silicon. The channel pad 155 may be disposed at a lower end of some of the channel structures CH. The channel pads 155 may include, for example, a doped semiconductor layer.

The first substrate structure 100 is a wiring structure and includes cell contact plugs 160 and cell wiring lines 170 disposed below the gate electrodes 130 and the channel structures CH.

Meanwhile, the second substrate structure 200 includes a second substrate 201, source/drain regions 205 and device isolation layers 210 in the second substrate 201, circuit elements 220 disposed on the second substrate 201, circuit contact plugs 270, a circuit wiring layer 280, and a second bonding layer 290.

In the second substrate 201, the device isolation layers 210 may be formed to define an active region. Source/drain regions 205 including impurities may be disposed in a portion of the active region. The second substrate 201 may be a semiconductor substrate, such as a silicon substrate. The circuit elements 220 may include a transistor having a gate dielectric layer 222, spacer layers 224, and a gate electrode 225. Source/drain regions 205 may be disposed in the second substrate 201 at both sides of the gate electrode 225.

The circuit wiring layer 280 may include a wiring insulating layer 281 disposed on the second substrate 201 and circuit wirings 282 and 283 in the wiring insulating layer 281. The circuit wirings may have a multilayer wiring structure including wiring lines 282 and vias 283 connecting the wiring lines 282. The circuit wiring layer 280 may include contact plugs 270 passing through the wiring insulating layer 281 to be connected to the source/drain regions 205. Electrical signals may be applied to the circuit element 220 through the contact plugs 270.

The first and second substrate structures 100 and 200 may include first and second bonding layers 190 and 290 disposed on outermost layers of the wiring structure, respectively.

The first bonding layer 190 of the first substrate structure 100 includes a first dielectric layer 191 disposed on the cell region insulating layer 190 and a first metal pad 195 embedded in the first dielectric layer 191. The first metal pad 195 may be electrically connected to cell contact plugs 160 and cell wiring lines 170 provided as a cell wiring structure.

Similarly, the second bonding layer 290 of the second substrate structure 200 includes a second dielectric layer 291 disposed on the circuit wiring layer 280 and a second metal pad 295 embedded in the second dielectric layer 191. The second metal pad 295 may be electrically connected to the circuit wirings 282 and 283.

As described above, in the hybrid bonding process of the first and second substrate structures 100 and 200, the first and second bonding layers 190 and 290 are polished to have a surface having a first depth (refer to FIG. 2A) recessed based on the surfaces of the first and second dielectric layers 191 and 291, and wet atomic layer etching is applied to the surface of the first and second bonding layers 190 and 290 so that the surfaces of the metal pads 195 and 295 are additionally recessed to a target depth. Subsequently, the first bonding layer 190 and the second bonding layer 290 may be hybrid-bonded using an annealing process to provide the semiconductor device 300 in which the first substrate structure 100 and the second substrate structure 200 are combined. As such, the first and second substrate structures 100 and 200 may be bonded electrically/mechanically by bonding the first metal pads 195 and the second metal pads 295 and bonding the first dielectric layer 191 and the second dielectric layer 291 to each other.

In the embodiment described above, an example in which the first and second semiconductor devices are different devices (a cell region and a peripheral circuit region) has been described, but the semiconductor devices to be bonded may be the same memory chips having a through-electrode, and an assembly of the semiconductor devices may be an HBM.

Figure 4:
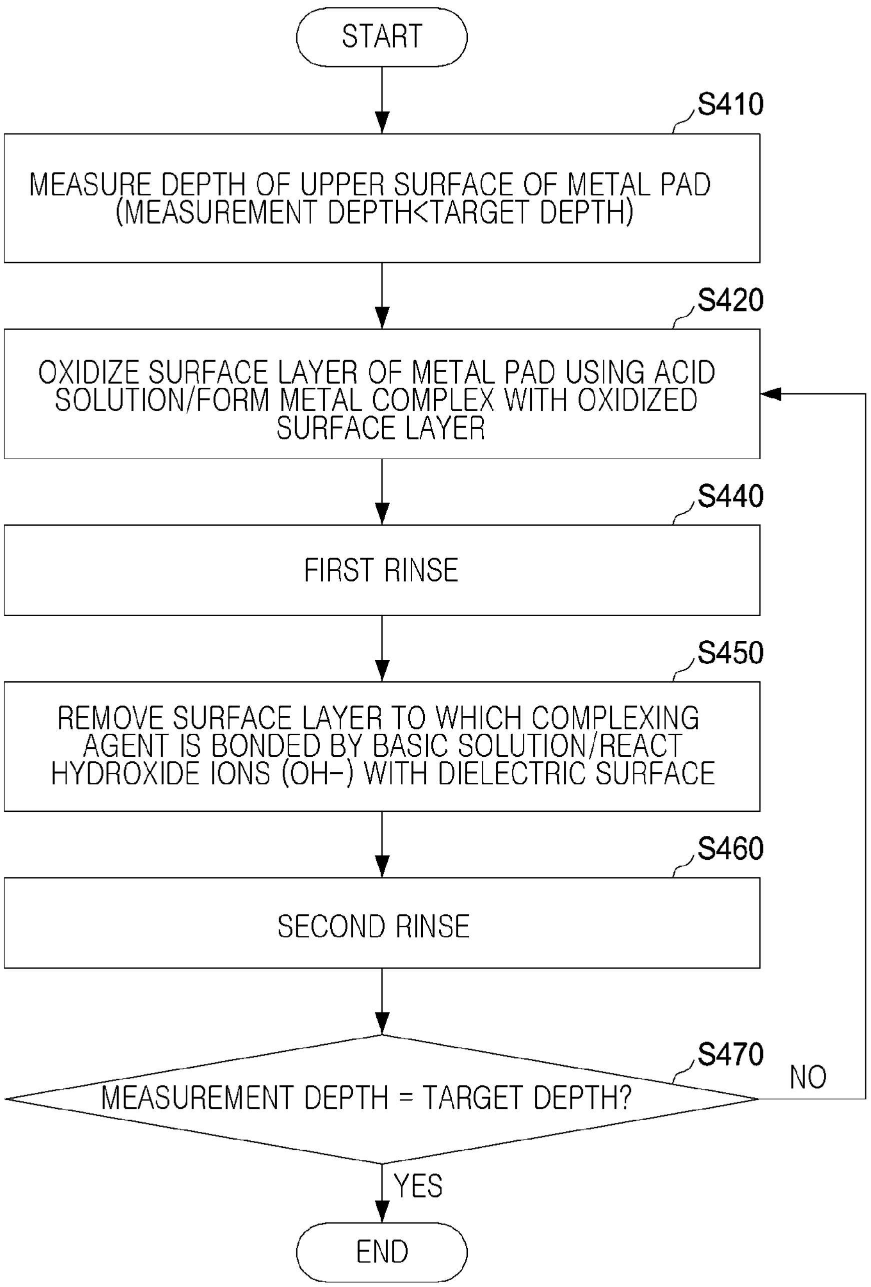
FIG. 4 is a process flowchart illustrating a wet atomic layer etching method employed in an embodiment of the present inventive concept.

FIG. 4 is a process flowchart illustrating a wet atomic layer etching method, and FIGS. 5A to 5E are cross-sectional views illustrating a wet atomic layer etching method.

Referring to FIG. 4, the wet atomic layer etching method according to the present embodiment may start with a process of measuring a depth of the upper surface of the metal pad (S410).

Figure 5A:
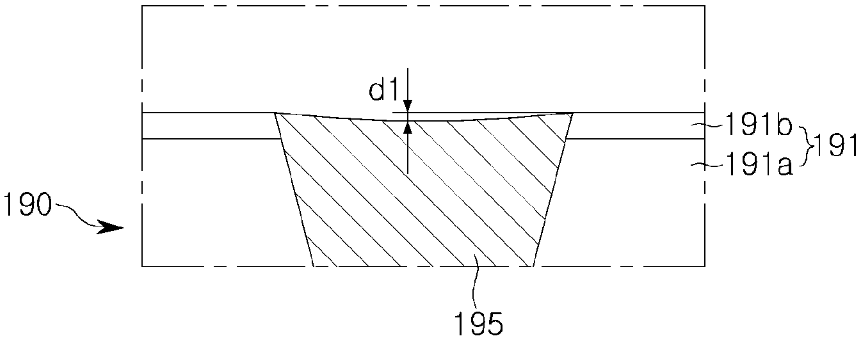
FIGS. 5A to 5E are cross-sectional views illustrating processes of a wet atomic layer etching method employed in an embodiment of the present inventive concept.

As illustrated in FIG. 5A, a dishing depth of the metal pad 195, that is, the depth d1 of the surface may be measured using an atomic force microscope (AFM). The metal pad 195 may be in a state in which a planarization process, such as CMP, has been completed. Planarization process conditions may be adjusted so that the surface of the metal pad 195 has the depth d1, which is less than a target depth. Conditions (in particular, the number of repetitions of the process or an exposure time of a solution) for a subsequent wet atomic layer etching process may be set according to the measured depth d1.

In some embodiments, since the depth of the metal pad may be estimated according to the conditions of the planarization process, in this case, the process of measuring the depth of the metal pad may be omitted.

Subsequently, a first reaction process (S420) of oxidizing a surface layer of the metal pad by applying an acid solution to the bonding layer and binding a metal complex to the oxidized surface layer may be performed.

Figure 5B:
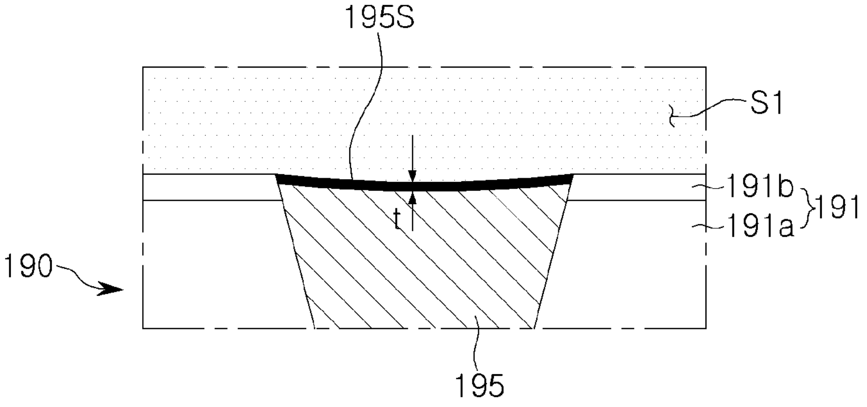

In some embodiments, the oxidation process and the metal complex formation process may be performed consecutively. For example, as illustrated in FIG. 5B, a surface layer 195S of the metal pad 195 may be oxidized by exposing the surface of the bonding layer 190 to an oxygen-containing solution S1. Here, the oxygen-containing solution S1 may be used as an oxidizing agent, and may be, for example, water ($H_2O$) or an alcohol, e.g., isopropyl alcohol (IPA) ($C_3H_8O$), or a liquid with oxygen dissolved therein, such as an oxygen saturated solution such as oxygen dissolved in acetone. When the metal pad 195 is copper, the oxidized surface layer 195S may include $CuO_x$ or $Cu(OH)_2$.

Figure 5C:
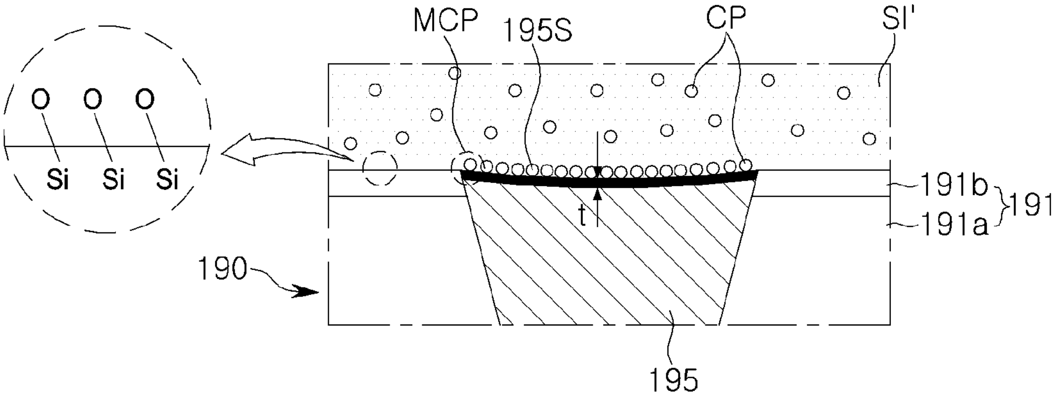

Subsequently, as illustrated in FIG. 5C, the oxidized surface layer 195S may be exposed to a solution S1' in which a complexing agent CP is dissolved, to form a metal complex MCP on the oxidized surface layer 195S. For example, the complexing agent CP may be oxalic acid ($C_2H_2O_4$), citric acid ($C_6H_8O_7$), or ascorbic acid ($C_6H_8O_6$). When a solution in which oxalic acid is dissolved is used, a metal complex may be formed as illustrated in reaction formula 1A or reaction formula 1B below.

$$Cu_2O+2C_2H_2O_4 \rightarrow Cu_2(HC_2O_2)_2+H_2O \quad \text{(reaction formula 1A)}$$

$$Cu(OH)_2+C_2H_2O_4 \rightarrow Cu(C_2O_4)+2H_2O \quad \text{(reaction formula 1B)}$$

The layer in which the metal complex is formed is a surface-modified layer to facilitate etching at an atomic layer level, and is also referred to as a "self-limiting layer". For example, a thickness t of the surface of metal pad 195 which is oxidized to form oxidized surface layer 195S, may be etched in a range of 1 Å to 10 Å or 2 Å to 6 Å. In some embodiments, the thickness t may range from 3 Å to 4 Å.

Alternatively, in some embodiments, the oxidation process and the metal complex formation process may be performed "together" using an oxygen-containing solution in which a complexing agent is dissolved. For example, instead of separately applying an oxygen containing solution S1 as in FIG. 5B followed by applying a complexing solution S1' as in FIG. 5C, the oxidizing agent of S1 can be provided with the complexing agent of S1' in the same solution and be applied to the metal pad 195 at the same time so as to oxidize metal pad 195 and form a metal complex in the same step. For example, the oxidizing agent may include water or IPA as a solvent and may be prepared to have oxalic acid having a concentration of 5 to 50 mM as the complexing agent.

Next, a first rinsing process (S440) for cleaning the bonding layer may be performed after the first reaction process.

In some embodiments, after the first reaction process is completed, a process of cleaning the acid solution S1' from the surface of the bonding layer 190 may be introduced. As a cleaning solution, water ($H_2O$) or isopropyl alcohol (IPA) ($C_3H_8O$) may be used.

Subsequently, the second reaction process (S450) of removing the surface layer to which the metal complex is bonded may be performed by applying a basic solution to the bonding layer.

Figure 5D:
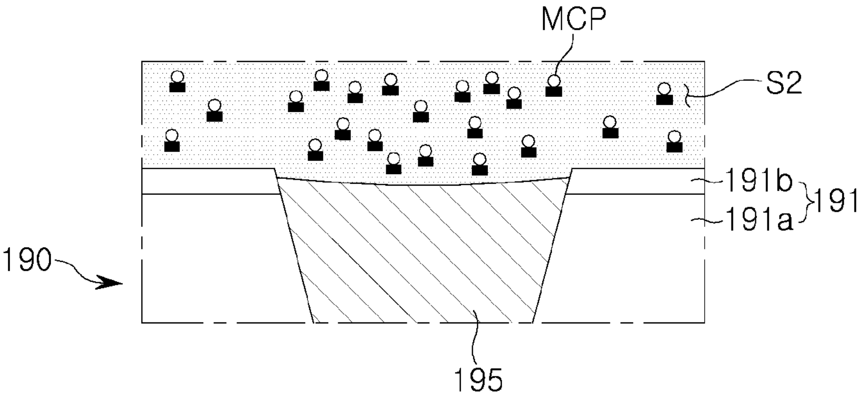
Figure 5E:
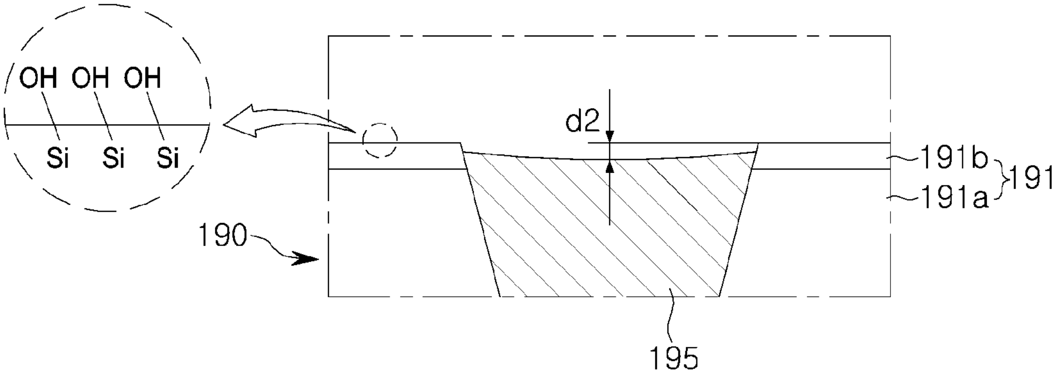

As illustrated in FIG. 5D, the metal complex layer MCP may be selectively removed from the metal pad 195 by exposing the bonding layer to the basic solution S2. By removing the metal complex layer MCP from the metal pad 195, a dishing step, that is, a depth d2 of the surface of the metal pad 195 may be reduced by the thickness t equal to the original surface layer that was oxidized.

In addition, the selective removal process using the basic solution S2 may be accompanied by a process of modifying the surface of the dielectric layer 191 to be advantageous for hybrid bonding. The surface modification of the dielectric layer 191, in particular, the second insulating layer 191*b*, may be implemented by the basic solution S2 used in the second reaction process without an additional process. Specifically, hydroxide ions (OH—) of the basic solution S2 may react with the dielectric surface to generate a silanol (Si—OH) group, and the silanol group may cause a condensation reaction (Si—OH+HO-Si→Si—O—Si+H2O) during hybrid bonding, and may serve as a bonding group that improves bonding strength.

In this second reaction process, the basic solution S2 is used as a solution for etching and removing the metal complex layer MCP, and may be, for example, ammonium hydroxide ($NH_4OH$). The solvent of the basic solution may be $H_2O$ or IPA, similar to the solvent of the previous solution. The solvent is not limited thereto, and a solvent that may be dissolved (e.g. at room temperature) may be used in both oxalic acid in the first reaction process and ammonium hydroxide in the second reaction process.

The basic solution may have a concentration lower than the solution used in the first reaction process. For example, the basic solution may be in the range of 0.5 to 5 mM, which is a 1/10 level of the acid solution. In order to optimize the wet atomic layer etching process according to the size (i.e., width) and/or spacing of the metal pads, the solvent may be changed or the concentration of the solution may be appropriately adjusted.

Next, a second rinsing process (S460) of cleaning the bonding layer may be performed after the second reaction process. After completing the second reaction process, a process of cleaning the basic solution S2 from the surface of the bonding layer 190 may be introduced. Similar to the cleaning solution of the first rinsing process, water ($H_2O$) or isopropyl alcohol (IPA) ($C_3H_8O$) may be used as the cleaning solution.

The first reaction process (S420), the first rinsing process (S440), the second reaction process (S450), and the second rinsing process (S460) may be performed once or more times until the metal pad is recessed to a desired depth (S470).

The wet atomic layer etching process employed in the present embodiment may precisely control a dishing step, that is, a surface depth of the metal pad, by etching several Å per cycle. For example, the wet atomic layer etching process may be repeatedly performed in the range of several to several tens of times (e.g., 5 to 50 times, or 10 to 30 times), or even 100 times or more if needed. As a result, a thickness further etched by the wet atomic layer etching process may be controlled in the range of several Å to several tens of nm. The wet atomic layer etching according to the present embodiment may be advantageously applied to a hybrid bonding process for a semiconductor device, such as a 3D semiconductor memory (refer to FIG. 3) employing a miniaturized metal pad (e.g. width: 2 μm or less, or 1 μm or less).

In addition, in the wet atomic layer etching process according to the present embodiment, a hydroxyl group of the basic solution reacts with the surface of the dielectric layer, so that the surface of the dielectric layer may have a modified surface advantageous for hybrid bonding. In the related art, the surface modification of the dielectric layer may be performed by an additional plasma treatment and cleaning process, but during the plasma treatment process, an undesired metal material of the metal pad may be re-sputtered and attached to the surface of the dielectric layer ("RS" in FIG. 6A). Therefore, by introducing the wet atomic layer etching process according to the present embodiment in the hybrid bonding process, the plasma treatment process for modifying the dielectric surface may be omitted. As such, after termination of the atomic layer etching atomic layer etching steps, the metal pads and surrounding dielectric layers are bonded together in the absence of an intermediate plasma treatment and/or plasma cleaning step.

In some embodiments, plasma treatment for surface modification may have been performed prior to the atomic layer etching as disclosed herein, which plasma treatment may have caused resputtering. However, if the amount of resputtered metal attached to the surface of the dielectric layer is not too large, the resputtered metal may be removed by a wet atomic layer etching process (Refer to FIGS. 6A and 6B).

Figure 6A:
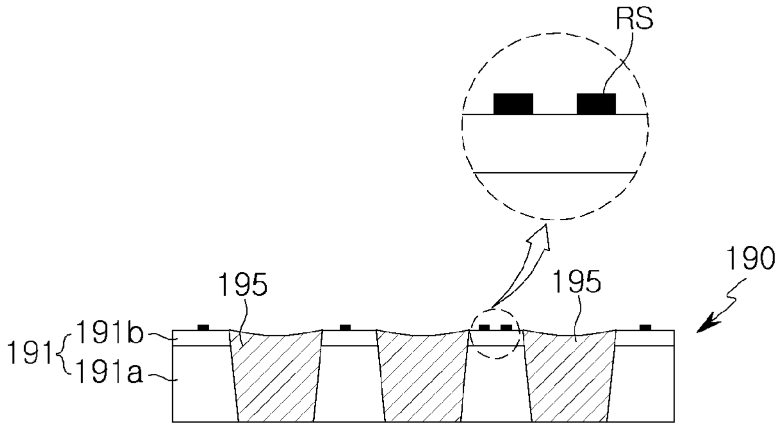
FIGS. 6A and 6B are cross-sectional views illustrating processes of a hybrid bonding method according to an embodiment of the present inventive concept.
Figure 6B:
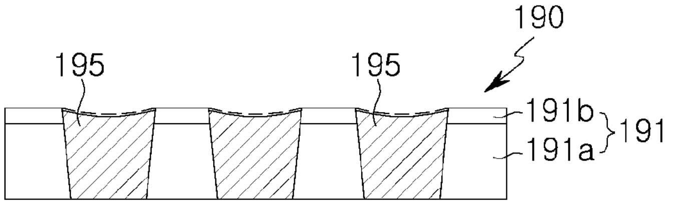

FIGS. 6A and 6B are cross-sectional views illustrating processes of a hybrid bonding method.

Referring to FIG. 6A, it may be understood that a plasma treatment process is performed to modify the surface of the dielectric layer 191. Such a plasma treatment process may be applied after a planarization process, such as CMP. As described above, during the plasma treatment process, a partial material of the metal pad 195 may be re-sputtered and attached to the surface of the dielectric layer 191 as indicated by "RS".

Referring to FIG. 6B, the bonding layer 190 is in a state after undergoing the wet atomic layer etching process described above with reference to FIGS. 5B to 5D. The metal body RS re-sputtered on the surface of the dielectric layer 191 may be removed together by a wet atomic layer etching process for adjusting the depth of the metal pad 195.

Example 1

Example 1 was conducted to confirm that a metal pad may be precisely controlled in a metal-dielectric bonding layer used in a hybrid process using a wet atomic layer etching process.

Figure 7:
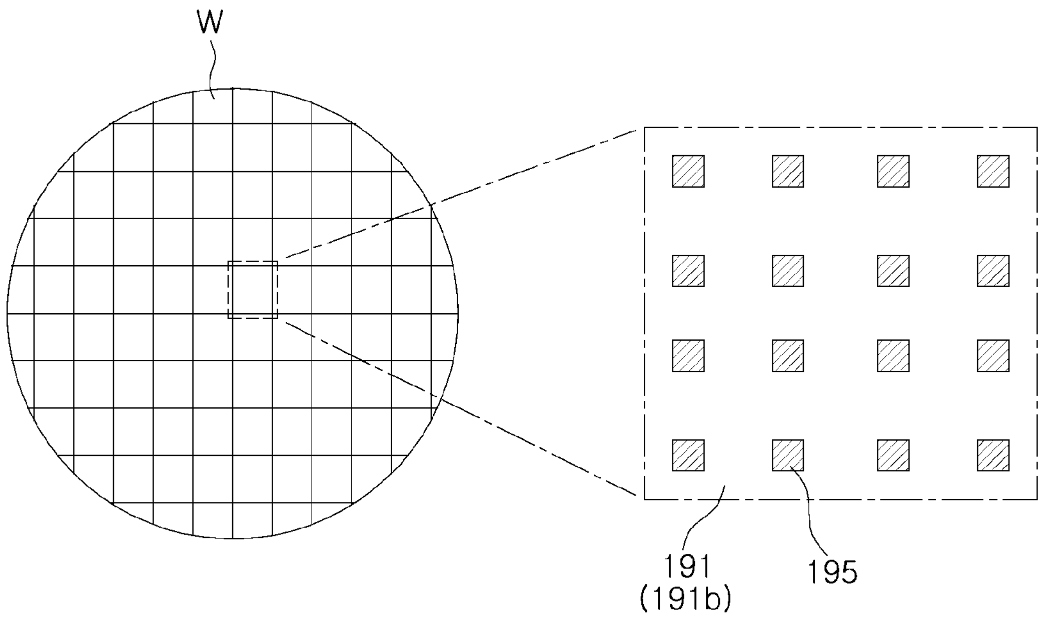
FIG. 7 is a plan view illustrating a wafer having a bonding layer for hybrid bonding.
Figure 8A:
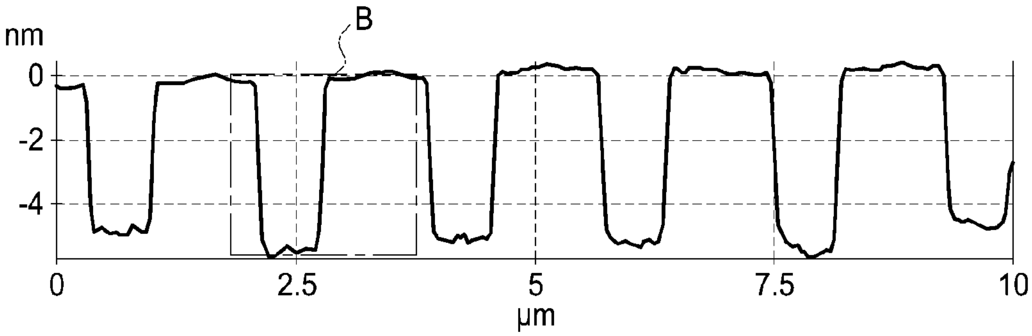
FIGS. 8A and 8B show atomic force microscope (AFM) measurement results of measuring a level difference (dishing depth) of a metal pad in a bonding layer.
Figure 8B:
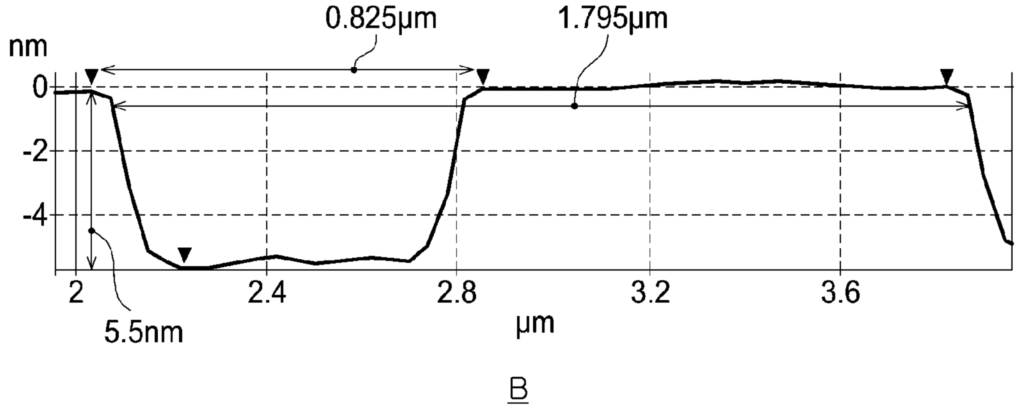

As illustrated in FIG. 7, a metal-dielectric bonding layer was formed on the surface of an actual substrate, and a CMP process was applied to expose a Cu metal pad on the surface of the bonding layer. A dielectric layer was formed of $SiO_2$/SiCN. In addition, the size (that is, width) of the metal pad and the distance between the metal pads were varied for each example. Specifically, in Example 1A, the size of the metal pad was set to 0.7 μm and the distance between the metal pads was set to 2 μm, in Example 1B, the size of the metal pad was set to 0.6 μm and the distance between the metal pads was set to 1.5 μm, and in Example 1C, the size of the metal pad was set to 0.4 μm and the distance between the metal pads was set to 1 μm. After a CMP process under the same conditions, a dishing step, that is, a surface depth, of the initial metal pad was measured with an atomic force microscope (AFM), and results thereof showed that a step of about 5 nm was present. The graphs of FIGS. 8A and 8B show a surface state of the pad having a size of 0.7 μm.

According to Example 1A, Example 1B, and Example 1C, the wet atomic layer etching process was applied to a bonding layer in which the metal pads were arranged in 10 cycles and 30 cycles, respectively. Here, in the wet atomic layer etching process, a 50 mM of oxalic acid aqueous solution was used as an acid solution for a first reaction process, and a 5 mM of ammonia aqueous solution was used as a basic solution for a second reaction process. After applying the wet atomic layer etching process, changes in depth of the metal pads were measured, and an average value (each of 16 samples) is illustrated in Table 1 below.

TABLE 1

| Classification | Example 1A | | | Example 1B | | | Example 1C | | |
|---|---|---|---|---|---|---|---|---|---|
| Pad width (μm) | | 0.7 | | | 0.6 | | | 0.4 | |
| Number of cycles | 0 | 10 | 30 | 0 | 10 | 30 | 0 | 10 | 30 |
| Average depth (nm) | 5.739 | 8.820 | 16.334 | 5.507 | 8.678 | 18.366 | 4.920 | 10.470 | 18.964 |

it can be seen that, after applying the wet atomic layer etching process at 10 cycles and 30 cycles, the depths of the metal pad of Examples 1A to 1C increased. In addition, an etching rate of about 3 Å to 4 Å per cycle was obtained. As such, it can be seen that the wet atomic layer etching process may be advantageously used to control a dishing step of the metal pad having a size of 1 μm or less.

In particular, since the wet atomic layer etching process according to the present embodiment may modify the surface of the dielectric layer without an additional process (e.g., plasma treatment) using a hydroxyl group of a basic solution, it may be advantageously introduced into a hybrid bonding process.

Figure 9:
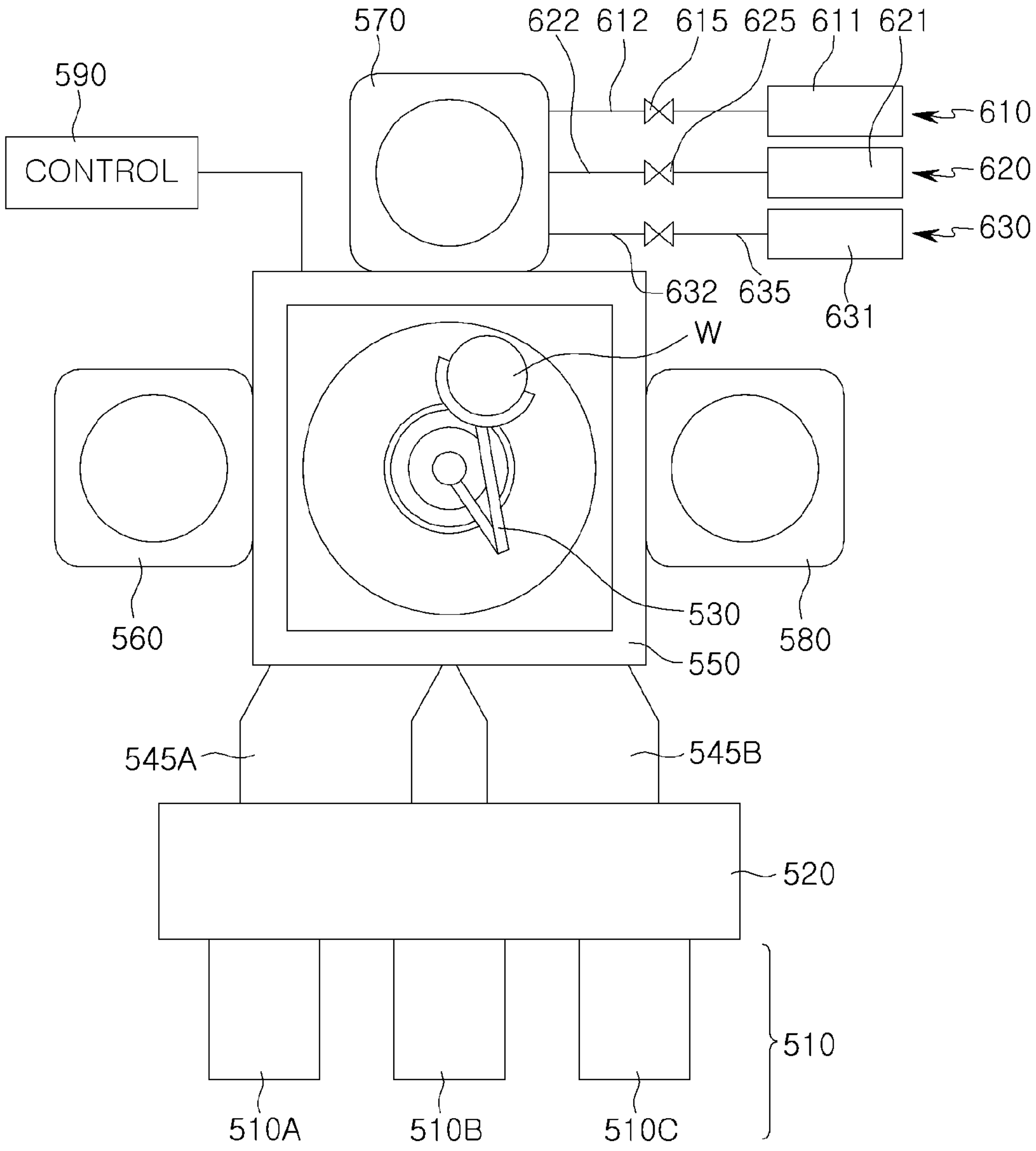
FIG. 9 is a schematic diagram illustrating a hybrid bonding system according to an embodiment of the present inventive concept.

FIG. 9 is a schematic diagram illustrating a hybrid bonding system.

Referring to FIG. 9, the hybrid bonding system 500 according to the present embodiment may include a load chamber 510 having a container in which a plurality of substrates W are received, a first transfer chamber 520 connected to the load chamber 510, a second transfer chamber 550, a measurement module 560, a wet atomic layer etching module 570, and a bonding module 580 each connected to the second transfer chamber 550, and a controller 590 controlling processes of these elements.

The first transfer chamber 520 may transfer a substrate W from the container of the load chamber 510 to the second transfer chamber 550 through load lock chambers 545A and 545B. In the present embodiment, the three load ports 510A, 510B, and 510C may be arranged at the front end of the first transfer chamber 520, but are not limited thereto, and may be provided as a single or various other numbers of load ports. The first transfer chamber 520 includes a transfer robot (not illustrated) in an internal space separated from the outside. The transfer robot may have a structure similar to that of a transfer robot 530 disposed in the second transfer chamber 550.

The hybrid bonding system 500 according to the present embodiment may be configured to implement a hybrid bonding process using the wet atomic layer etching process described above with reference to FIG. 1.

The measurement module 560, the wet atomic layer etching module 570, and the bonding module 580 may be arranged around the second transfer chamber 550. The measurement module may be combined with an additional component, such as an atomic layer microscope to measure a depth of a metal pad. In some embodiments, when pre-measured depth information is pre-measured and provided to the controller 590, the measurement module 560 may be omitted.

The wet atomic layer etching module 570 may include an etching chamber for selectively wet etching a surface of the metal pad of the substrate W, a first supply unit 610 for supplying an acid solution into the etching chamber, a second supply unit 620 supplying a base solution into the etching chamber, and a third supply unit 630 supplying a cleaning solution into the etching chamber. The acid solution is a solution for carrying out a first reaction process, and the basic solution is a solution for carrying out a second reaction process. In addition, the cleaning solution is a solution introduced for first and second rinsing processes. The first to third supply units include first to third storage units 611, 621, and 631 in which corresponding liquids are stored, the first to third pipes 612, 622, and 632 connecting the etching chamber to each of the first to third storage units 611, 621, and 631, and first to third valves 615, 625, and 635 installed in the first to third pipes 612, 622, and 632 to control flow rates. The liquid supplied to the first to third pipes 612, 622, and 632 may be controlled by the first to third valves 615, 625, and 635 configured to be operated by the controller 590.

The bonding module 580 may be configured to bond two substrates W processed by the wet atomic layer etching module 570. The bonding module 580 may include a pressing device to increase internal pressure during bonding.

The controller 590 may be configured to control not only the wet atomic layer etching module 570 but also the hybrid bonding system 500 as a whole. The controller 590 may include at least one of, for example, a personal computer (PC), a desktop computer, a lap-top computer, a computer workstation, a tablet PC, a server, a mobile computing device, and combinations thereof, but is not limited thereto.

Figure 10A:
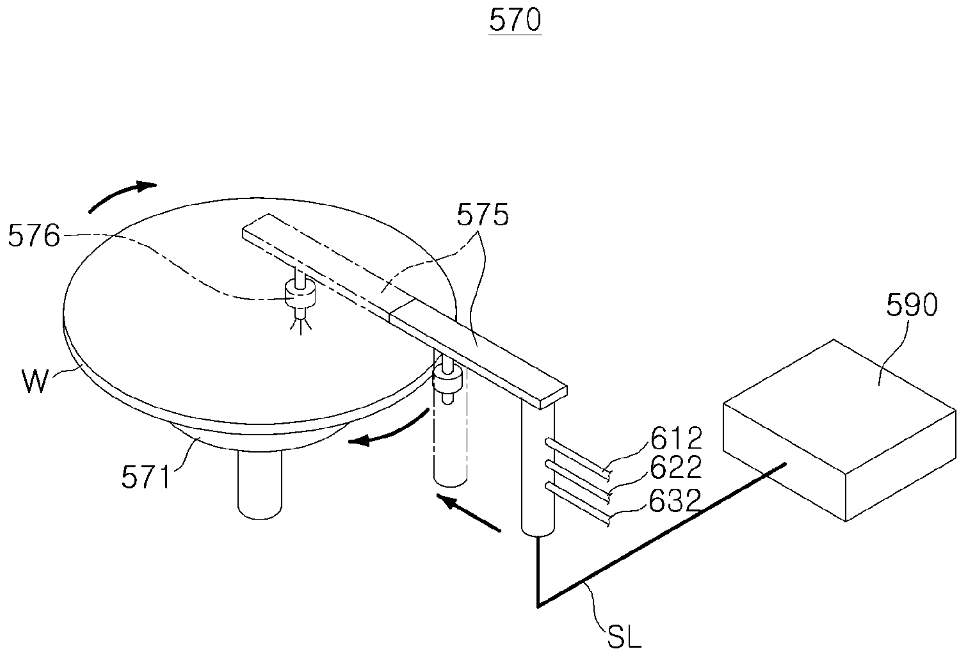
FIGS. 10A and 10B are schematic views illustrating various examples of a wet atomic layer etching device (chamber) employable in the hybrid bonding system illustrated in FIG. 9.
Figure 10B:
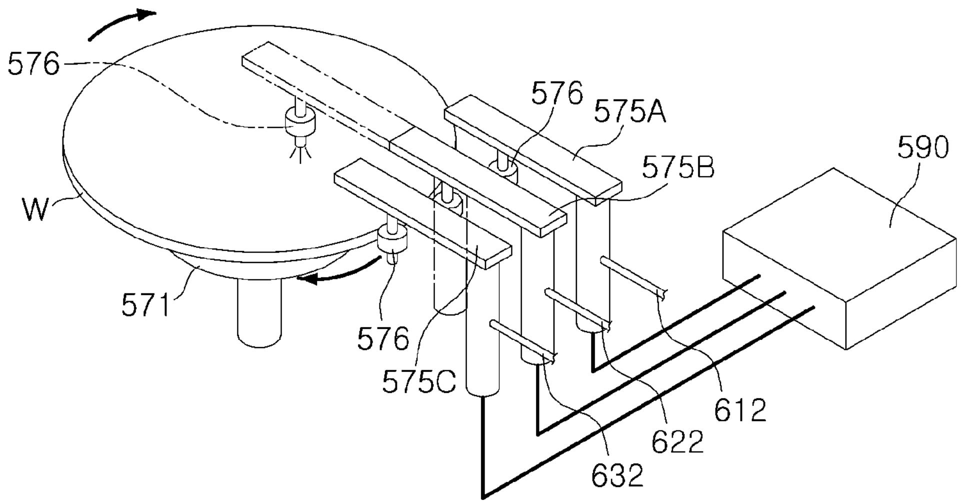

The wet atomic layer etching module 570 employed in the present embodiment may supply a solution required for a reaction to the surface of the bonding layer of the substrate by using a nozzle spray and a spinner method. However other modes of applying solutions, such as dip coating etc. may also be used. FIGS. 10A and 10B are schematic diagrams illustrating various examples of wet atomic layer etching modules employable in the hybrid bonding system 500 illustrated in FIG. 9.

Referring to FIG. 10A, the wet atomic layer etching module 570 employable in the present embodiment may include a spinner 571 and a spray unit 575. The movement and injection amount of the spray unit and rotation of the spinner 571 may be controlled by a signal SL from the controller 590.

The substrate W may be disposed on the spinner 571. The spinner 571 may fix and rotate the substrate W. For example, a spin chuck 571 may fix the substrate W using vacuum pressure or electrostatic force, and may rotate the fixed substrate W at a predetermined RPM. In some embodiments, the spinner 571 may rotate the substrate W at high speed so that a chemical liquid provided on the substrate W is uniformly distributed to the surface.

The spray unit 575 may include a nozzle 576 for spraying the chemical liquid. After moving the nozzle 576 to the central region of the substrate W (indicated by the dotted line), the spray unit 575 may spray the chemical liquid onto the substrate W. The chemical liquid sprayed through the nozzle 576 may be supplied through the first to third pipes 612, 622, and 632 connected to the spray unit 575. The first pipe 612 may be configured to supply an acid solution, such as an aqueous solution of oxalic acid, and the second pipe 622 may be configured to supply a basic solution, such as an aqueous solution of ammonium hydroxide. The third pipe 632 may be configured to supply water or IPA as a cleaning solution used in the first and second rinsing processes. In some embodiments, a supply unit for another cleaning solution or an additional reaction liquid may be further included, and an additional pipe may be connected to the spray unit 575 accordingly.

Referring to FIG. 10B, the wet atomic layer etching module 570A, which may be employed according to the present embodiment, may be understood as having a structure similar to that of the wet atomic layer etching module 570 illustrated in FIGS. 9 and 10A, except that the wet atomic layer etching module 570A includes three spray units 575A, 575B, and 575C. In addition, components of the present embodiment may be understood with reference to descriptions of the same or similar components of the wet atomic layer etch module 570 illustrated in FIGS. 9 and 10A unless otherwise stated.

The wet atomic layer etching module 570A may include first to third spray units 575A, 575B, and 575C for supplying different chemical liquids. For example, the first spray unit 575A may be connected to the first pipe 612 and configured to spray the acid solution onto the substrate W on the spinner 571, and the second spray unit 575B may be connected to the second pipe 622 and may be configured to spray the base solution onto the substrate W on the spinner 571. In addition, the third spray unit 575C may be connected to the third pipe 632 and may be configured to spray the cleaning solution onto the substrate W on the spinner 571. According to the signal SL from the controller 590, the first to third spray units 575A, 575B, and 575C may be moved to spray positions, respectively, or a spray amount thereof may be adjusted.

According to the examples above, after chemical mechanical polishing (CMP) is applied to a metal pad-dielectric bonding layer in hybrid bonding, a dishing depth of the metal pad may be precisely controlled (e.g., a few to tens of Å) using a wet atomic layer etching process.

In addition, by modifying the dielectric surface using a solution introduced into the wet atomic layer etching process, the plasma process for surface modification of the dielectric layer may be omitted, and a disadvantageous re-sputtering problem due to the plasma process may be solved fundamentally.

It is also possible to use other types of self-limiting processes, such as electrochemical atomic layer etching, plasma atomic layer etching or thermal atomic layer etching to target a specific metal pad depth. For example, a copper thermal atomic layer etching process could be performed where $O_2$ or $O_3$ is used for oxidation of the surface layer of a copper pad to form a surface layer of $Cu_2O$ or CuO, followed by removal of the copper oxide surface layer by hexafluoroacetylacetone. Or a copper or cobalt pad can be oxidized in an $O_2$ plasma, followed by removal of the surface oxide layer with formic acid vapor. A tungsten pad can be oxidized using ozone, followed by removing the oxidized surface layer with $BCl_3$ and HF.

A combination of self-limiting processes can be utilized, such as plasma atomic layer etching followed by wet atomic layer etching, whereby a series of plasma atomic layer etching steps may increase throughput followed by a series of wet atomic layer etching steps capable of removing resputtered material caused by the earlier plasma steps. Also, combination atomic layer etching steps can be provided for a single surface layer, such as oxidation of a surface layer with $O_2$ or $O_3$ followed by a wet surface modification with an acid solution and a wet modified surface layer removal with an ammonium hydroxide solution.

While example embodiments have been shown and described above, it will be apparent to those skilled in the art that modifications and variations could be made without departing from the scope of the present inventive concept as defined by the appended claims.

What is claimed is:

1. A method of manufacturing a semiconductor device, the method comprising:

preparing a first substrate and a second substrate, the first substrate including a first bonding layer having a first metal pad and a first dielectric layer and the second substrate including a second bonding layer having a second metal pad and a second dielectric layer;

performing a planarization process on a surface of the first bonding layer and performing a planarization process on a surface of the second bonding layer;

applying wet atomic layer etching (wet ALE) to the surface of the first bonding layer and/or to the surface of the second bonding layer, so that a surface of the first metal pad and/or a surface of the second metal pad is recessed to a target depth, wherein the applying of the wet atomic layer etching includes reacting hydroxide ions (OH—) of a basic solution with the surface of the first dielectric layer and/or the second dielectric layer; and bonding the first bonding layer of the first substrate to the second bonding layer of the second substrate using an annealing process.

2. The method of claim 1, wherein, after the planarization process, the first metal pad is recessed relative to the first dielectric layer to a depth less than the target depth, and the second metal pad is recessed relative to the second dielectric layer to a depth less than the target depth.

3. The method of claim 1, wherein the applying of the wet atomic layer etching includes:

oxidizing a surface layer of the first metal pad and/or a surface layer of the second metal pad using an oxidizing agent and forming a metal complex by reacting the oxidized surface layer of the first metal pad and/or the oxidized surface of the second metal pad with an acid solution, wherein the oxidizing agent is applied to the surface layer of the first metal pad and/or the surface layer of the second metal pad prior to or concurrently with the acid solution; and removing the surface layer of the first metal pad and/or the surface layer of the second metal pad by removing the metal complex.

4. The method of claim 3, wherein the removing of the surface layer of the first metal pad and/or the surface layer of the second metal pad is performed by using a basic solution, and the reaction of the hydroxide ions (OH—) of the basic solution with the surface of the first dielectric layer and/or the surface of the second dielectric layer generates a silanol (Si—OH) group.

5. The method of claim 3, wherein the forming of the metal complex includes:

exposing the surface of the first bonding layer and/or the surface of the second bonding layer to an oxygen-containing solution to oxidize the surface layer of the first metal pad and/or the surface layer of the second metal pad; and exposing the oxidized surface layer of the first metal pad and/or the oxidized surface layer of the second metal pad to the acid solution to form the metal complex.

6. The method of claim 3, wherein the acid solution comprises an oxygen-containing solution including at least one of oxalic acid, citric acid and ascorbic acid.

7. The method of claim 3, wherein the removing of the surface layer which forms part of the metal complex includes reacting hydroxide ions (OH—) with the metal complex.

8. The method of claim 3, wherein the forming of the metal complex and the removing of the surface layer of the first metal pad and/or the surface layer of the second metal pad are repeatedly performed a plurality of times until the surface of the first metal pad and/or the second metal pad is recessed to the target depth.

9. The method of claim 8, wherein the wet atomic layer etching includes etching a thickness of the first metal pad and/or a thickness of the second metal pad in a range of 1 Å to 10 Å per time.

10. The method of claim 3, further comprising rinsing the first bonding layer and/or the second bonding layer between the forming of the metal complex and the removing of the surface layer of the first metal pad and/or the surface layer of the second metal pad, and after the removing of the surface layer of the first metal pad and/or the surface layer of the second metal pad.

11. The method of claim 1, wherein a width of the first metal pad and/or the second metal pad is 10 μm or less.

12. The method of claim 1, further comprising measuring a recessed depth of the first metal pad and/or the second metal pad, after the planarization of the first bonding layer and/or the second bonding layer.

13. The method of claim 1, wherein the annealing process is performed at a temperature of 250° C. or higher.

14. The method of claim 1, wherein, in the planarization of the first bonding layer and/or the planarization of the second bonding layer, the surface of the first metal pad and/or the surface of the second metal pad protrudes, relative to a surface of the corresponding first dielectric layer or the second dielectric layer.

15. The method of claim 1, wherein, in the bonding, the first metal pad and/or the second metal pad expand so that the surfaces of the first metal pad and the second metal pad come into contact with each other to be bonded.

16. A method of manufacturing a semiconductor device, the method comprising:

preparing a first substrate including a first bonding layer having first metal pads and a first dielectric layer and a second substrate including a second bonding layer having second metal pads and a second dielectric layer;

polishing the first bonding layer and the second bonding layer such that the first metal pads have a surface substantially coplanar with a surface of the first dielectric layer and the second metal pads have a surface substantially coplanar with a surface of the second dielectric layer, each metal pad having a surface recessed to a first depth, relative to the surface of the respective dielectric layer;

for each of the first bonding layer and the second bonding layer, applying wet atomic layer etching to a surface of the bonding layer so that the surface of the corresponding metal pads is recessed to a second depth, deeper than the first depth; and bonding the first bonding layer of the first substrate to the second bonding layer of the second substrate using an annealing process, wherein the applying of the wet atomic layer etching includes:

oxidizing a surface layer on the surface of the corresponding metal pads and forming a metal complex on the oxidized surface layer, using an acid solution; and removing the surface layer to which the metal complex is bonded using a basic solution and reacting hydroxide ions (OH—) of the basic solution with the surface of the corresponding dielectric layer.

17. The method of claim 16, wherein the acid solution includes at least one of oxalic acid, citric acid, and ascorbic acid, and a solvent of the acid solution includes water or isopropyl alcohol (IPA) ($C_3H_8O$).

18. The method of claim 16, wherein the basic solution includes ammonium hydroxide, and a solvent of the basic solution contains water or isopropyl alcohol.

19. The method of claim 16, wherein the first dielectric layer and the second dielectric layer include at least one of $SiO_2$, SiN, SiCN, SiOC, SiON, and SiOCN.

20. The method of claim 16, further comprising:

rinsing the first bonding layer and/or the second bonding layer between forming the metal complex, and the removing of the surface layer of the first metal pads and/or the surface layer of the second metal pads, and after the removing of the surface layer of the first metal pads and/or the surface layer of the second metal pads, wherein a cleaning solution used in the rinsing includes water or isopropyl alcohol.

* * * * *